United States Patent [19]
Smith et al.

[11] Patent Number: 6,112,068
[45] Date of Patent: Aug. 29, 2000

[54] PHASE-LOCKED LOOP CIRCUIT WITH SWITCHABLE OUTPUTS FOR MULTIPLE LOOP FILTERS

[75] Inventors: Donald E. Smith, Plano; Andrew M. Henwood, Dallas; William A. Bacon, Keller, all of Tex.

[73] Assignee: Texas Instruments Incorporated, Dallas, Tex.

[21] Appl. No.: 08/996,008

[22] Filed: Dec. 22, 1997

[51] Int. Cl.$^7$ ................................................. H04Q 7/32
[52] U.S. Cl. .................... 455/260; 455/259; 455/258; 455/230; 455/236.1; 455/256; 455/313; 455/318
[58] Field of Search ........................ 455/260, 259, 455/258, 230, 236.1, 256, 255, 250.1, 313, 318, 323, 264

[56] References Cited

U.S. PATENT DOCUMENTS

| | | | |
|---|---|---|---|
| 4,510,461 | 4/1985 | Dickes et al. | 455/260 |
| 4,745,371 | 5/1988 | Haine | 455/260 |
| 5,166,642 | 11/1992 | Hietala | 455/260 |
| 5,519,887 | 5/1996 | Lieu | 455/260 |

*Primary Examiner*—Fan Tsang
*Assistant Examiner*—Keith Ferguson
*Attorney, Agent, or Firm*—Ronald O. Neerings; Frederick J. Telecky, Jr.

[57] ABSTRACT

An electronic system, such as a wireless telephone handset (10), having multiple voltage-controlled oscillators (26, 28) so that the system can operate in a selected one of multiple frequency bands, is disclosed. Each of the voltage-controlled oscillators (26, 28) is associated with one of multiple loop filters (32, 34), which filter the control voltage (CP1, CP2) responsive to which the frequency of oscillation of the voltage-controlled oscillators (26, 28) controlled. Only one of the voltage-controlled oscillators (26, 28) is enabled at any one time, responsive to a control signal (VCOSEL). Synthesizer circuitry (30) includes a phase detector (44) which is coupled to a common node (VCOCLK) at which outputs of the voltage-controlled oscillators (26, 28) are coupled; the phase detector (44) compares the phase of this signal (VCODIV) to a reference signal (REFDIV) based on a reference clock (REFCLK), and controls a charge pump (46) accordingly. A switch (48) is provided to selectably apply the output of the charge pump (46) to the loop filter (32, 34) associated with the selected voltage-controlled oscillator (26, 28).

20 Claims, 1 Drawing Sheet

PHASE-LOCKED LOOP CIRCUIT WITH SWITCHABLE OUTPUTS FOR MULTIPLE LOOP FILTERS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of communications circuitry, and is more specifically directed to phase-locked loop circuitry in multiple frequency band applications.

Many advances have recently been made in the field of telecommunications, particularly in digital wireless telecommunication technology. In particular, modern digital telephones now operate at extremely high frequencies, thus providing high quality portable voice and data communications. These advantages in digital wireless telecommunication are expected to result in widespread use of this technology, as well as in new applications for digital wireless communication.

As is well known in the field of digital telecommunications, the operation of each transceiving device, such as a telephone handset, must be synchronized with the digital signals being communicated. This synchronization takes place at a selected channel within a frequency band specified by the particular communications protocol. For example, in one high-frequency digital communications protocol, three hundred seventy-four channels are specified for transmission, from a handset to the network, within a band of 1710 MHz to 1785 MHz; similarly, three hundred seventy-four receive channels are specified over a different band (e.g., between 1805 MHz and 1880 MHz). The use of multiple channels, of course, permits a large number of communications to be simultaneously ongoing, with a minimum of interference. Synchronization of the handset to the selected channels is, of course, necessary to ensure proper communication.

A well known circuit for synchronizing the operation of a system to a periodic signal is the phase-locked loop. Fundamentally, a phase-locked loop includes a phase detector for determining the temporal relationship of the phase-locked loop output signal, on one hand, to a reference signal with which the phase-locked loop is to be synchronized. The phase detector circuit controls a charge pump in a manner corresponding to the phase relationship of the two signals. The charge pump charges or discharges a capacitor in a low-pass loop filter in response to the phase detector output. The filtered voltage is applied to a voltage-controlled oscillator (VCO), which generates a periodic signal at a frequency determined by the charge pump output. Accordingly, the output of the phase detector determines whether the frequency of the VCO is to be advanced or retarded; continued operation eventually results in the VCO output "locking-in" upon the reference signal.

In some instances during a digital wireless communication, the phase-locked loop must perform its synchronizing function very rapidly. For example, if the portable digital telephone moves from one "cell" to another during a transmission, the phase-locked loop may have to rapidly change operating frequency from one channel to another within the band to accomplish "handing off" of the communication from cell-to-cell. As such, it is important for the phase-locked loop circuitry in a modern digital telephone to rapidly respond in changing operational frequencies from channel to channel within a band. Conventional telecommunications specifications and standards typically specify a time within which the phase-locked loop must synchronize to a new frequency.

One well-known telecommunications standard, referred to as the GSM digital telecommunications standard, requires digital telephone equipment to be operable in either of two frequency bands. In this example, one frequency band specifies transmissions to be made by the handset at frequencies between about 880 MHz and 915 MHz, and for signals to be received by the handset at frequencies between about 925 MHz, and 960 MHz; a second frequency band specifies handset transmissions at frequencies between about 1710 MHz and 1785 MHz, and communications received by the handset at frequencies between about 1805 MHz and 1880 MHz. Accordingly, each telephony device must be capable of operating within either of these frequency bands in order to satisfy the GSM digital communications standard.

Because of the wide separation between the two GSM frequency bands (the higher frequency band being at approximately twice the frequency of the lower frequency band), a single conventional VCO cannot accurately deliver frequencies over both of the bands. As such, a brute force way to implement the GSM standard in telephonic equipment would be to incorporate two PLLs, one for each band, duplicating the VCO, phase detector, charge pump, and loop filter. In other applications, even in cases where the frequency bands are relatively close, differences in lock-in times or in acceptable phase noise levels may necessitate the use of two PLLs. In any event, this brute force approach requires double the integrated circuit chip area for the implementation of both PLLs, which is of course inefficient.

BRIEF SUMMARY OF THE INVENTION

It is therefore an object of the present invention to provide a phase-locked loop circuit that is operable in a selectable one of multiple frequency bands.

It is a further object of the present invention to provide such a phase-locked loop that may be efficiently implemented into minimal integrated circuit chip area.

It is a further object of the present invention to provide such a phase-locked loop in which the loop filters may be optimized for each of the multiple frequency bands.

It is a further object of the present invention to provide such a phase-locked loop capable of high performance synchronization.

It is a further object of the present invention to provide an electronic system, such as a wireless telephone handset, having such a phase-locked loop circuit.

Other objects and advantages of the present invention will be apparent to those of ordinary skill in the art having reference to the following specification together with its drawings.

The present invention may be implemented by providing multiple voltage-controlled oscillators (VCOs) having their outputs connected together and scaled according to the desired communications channel frequency, and applied to an input of a phase detector circuit. Only one of the VCOs is operable at any given time. The phase detector also receives a reference clock signal, and generates pulses applied to a charge pump in response to the phase relationship of the scaled VCO output. Switches are connected to the output of the charge pump to forward the charge pump output to one of multiple loop filters, selected according to which of the multiple VCOs is enabled. The loop filters can thus be optimized for their associated frequency band.

DETAILED DESCRIPTION OF THE INVENTION

As will become apparent from the following description, the present invention will be beneficial in many types of electronic systems, particularly in systems that are operable in a selected one of multiple frequency bands.

In this regard, it has been observed in connection with the present invention that the efficient implementation of phase-locked loop (PLL) based frequency synthesis or clock recovery circuitry, where the circuitry is to operate in a selected one of multiple frequency bands, is quite difficult. As noted above, multi-band PLL-based circuits will typically have multiple voltage-controlled oscillators (VCOs). Of course, one may simply utilize multiple PLLs for the multiple frequency bands, but such an arrangement is necessarily inefficient.

It has also been observed, in connection with the present invention, that efficiency in implementation of a multi-band PLL-based frequency synthesis or recovery circuit renders it desirable to utilize common circuitry in the PLL circuit for the multiple bands. In this regard, the use of a multiplexer to selectively apply the output of the selected VCO to the input of the PLL circuit has been considered, but such multiplexing circuitry and associated techniques necessarily introduce noise and circuit duplication, particularly at high frequencies. It was observed, in connection with the present invention, that it is desirable to simply connect the outputs of the multiple VCOs in common at the PLL, because of the realization that only one of the multiple VCOs will be active at any one time in these types of systems, thus avoiding the insertion of a multiplexer and the duplication of other circuitry.

The use of common circuitry for PLL-based operations in a selected one of multiple frequency bands has limits, however. In particular, it has been discovered, in connection with the present invention, that the optimization of a loop filter in a PLL circuit is somewhat frequency dependent. This frequency dependence renders it quite difficult to provide a high-performance PLL circuit having a single loop filter that may operate in a selected one of multiple frequency bands, where the frequency bands widely differ from one another. This difficulty is exacerbated in implementations having tight lock-in specifications; for example, digital wireless telephones operating according to the GSM standard are required to lock-in upon a frequency change within approximately 500 $\mu$sec. This level of performance is not readily achievable in a PLL circuit using a single loop filter, over frequency bands having frequencies that may differ from one another by on the order of a factor of two.

Figure 1:
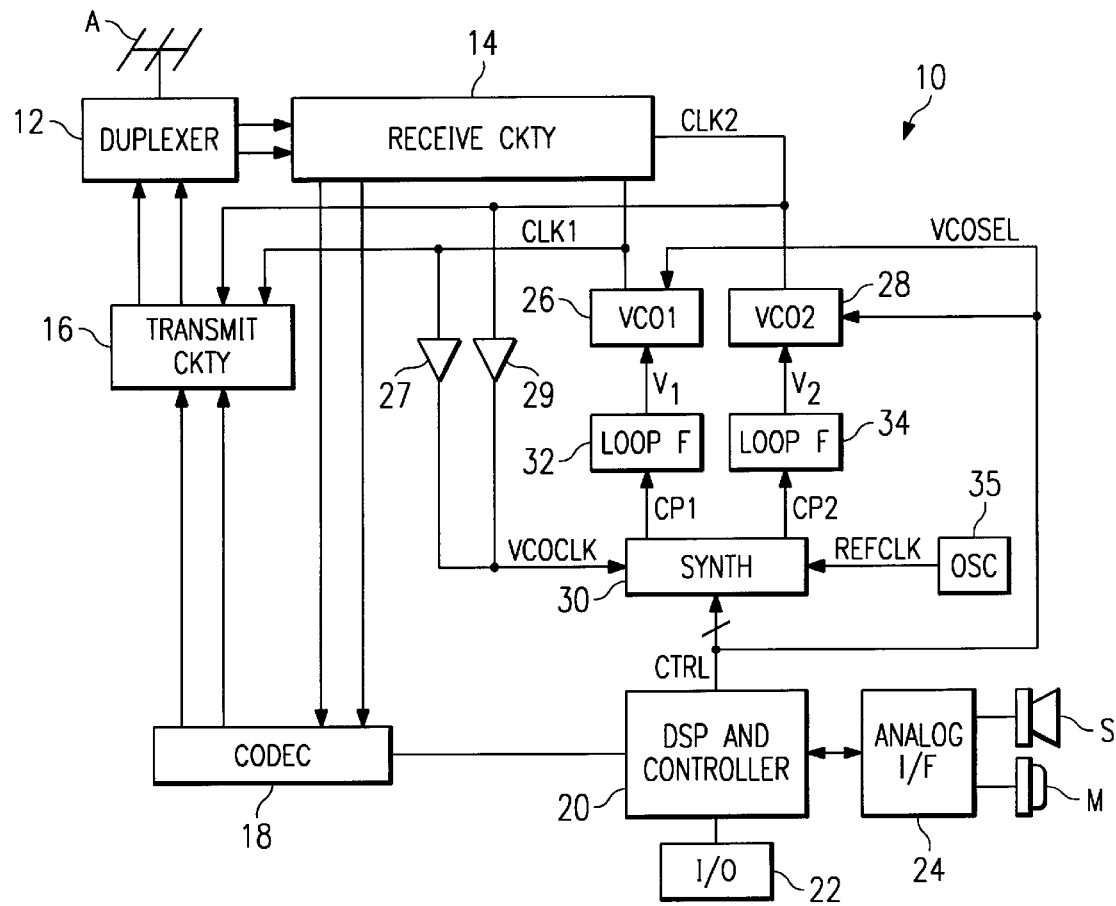
FIG. 1 is an electrical diagram, in block form, of a digital wireless telephone handset constructed according to the preferred embodiment of the present invention.

Accordingly, the present invention may be beneficially used in any multiple frequency band system, particularly where the frequency bands significantly differ in frequency, and especially where high performance is necessary. Referring now to FIG. 1, an exemplary electronic system constructed according to the preferred embodiment of the invention will now be described by way of example, it being understood that the present invention may be used to benefit in many other applications, as noted above. In this example, the exemplary system is digital wireless telephone handset 10 which is operable in either of two frequency bands; in this example, one such band is centered at about 900 MHz while a second frequency band is centered at about 1800 MHz, as is typical for telephone communications according to the GSM standard.

In this example, handset 10 includes antenna A, at which incoming communications are received and from which transmissions are made. Antenna A is connected to duplexer 12, which is conventional circuitry for effecting full-duplex (i.e., bi-directional) communications. As such, duplexer 12 is connected both to receive circuitry 14 and to transmit circuitry 16. Receive circuitry 14 includes typical digital wireless telephone receiver functions, such as amplification, mixing, demodulation, and the like; the output of receive circuitry 14 presents the processed received signals to coder/decoder (codec) 18 for analog-to-digital conversion (if necessary), and decoding. On the transmit side, transmit circuitry 16 includes typical amplification and modulation circuitry, for receiving signals from codec 18 and for modulating and amplifying these coded signals for application to duplexer 12 and transmission.

Codec 18 interfaces with digital signal processor (DSP) and controller circuitry 20 by way of a digital interface. DSP and controller circuitry 20 controls the general operation of handset 10 in response to input/output devices 22, examples of which include a keypad or keyboard, a user display, and add-on cards. DSP and controller circuitry 20 also manages other functions such as connection, radio resources, power source monitoring, and the like. A digital signal processing portion of DSP and controller circuitry 20 performs conventional signal processing such as speech coding and decoding, error correction, channel coding and decoding, equalization, demodulation, encryption, voice dialing, echo cancellation, and other similar functions in handset 10. Associated support circuitry useful in the general operation of handset 10, such as voltage regulators, power sources, operational amplifiers, clock and timing circuitry, switches and the like are not illustrated in FIG. 1 for clarity; it is contemplated that those of ordinary skill in the art will readily understand the architecture of handset 10 from this description.

Handset 10 also includes microphone M for receiving audio input, and speaker S for outputting audible output, in the conventional manner. Microphone M and speaker S are connected to analog interface 24 which, in this example, includes the appropriate analog-to-digital conversion, digital-to-analog conversion, and filtering functions for communication of signals to and from microphone M and speaker S. Analog interface 24 is in communication with DSP and controller circuitry 20 by a digital interface.

As is fundamental in the art, receive circuitry 14 and transmit circuitry 16 operate substantially at radio frequencies which, in this example, are in the hundreds of MHz. In this example, as noted above, handset 10 operates within a selected one of two possible frequency bands according to the GSM standard; as such, two voltage controlled oscillators (VCOs) 26, 28 are provided in handset 10. VCO1 26 generates a periodic signal at its output on line CLK1 that varies, within a specified frequency range, according to the voltage applied on line V1 to its input, while VCO2 28 generates a periodic signal at its output on line CLK2 that varies, within a specified frequency range different from that of VCO1 26, according to the voltage applied to its input on line V2. The lower of the two frequency bands corresponds to transmissions made by handset 10 at frequencies between about 880 MHz and 915 MHz, and signals received by handset 10 at frequencies between about 925 MHz and 960 MHz; the higher frequency band specifies handset transmissions at frequencies between about 1710 MHz and 1785 MHz, and communications received by handset 10 at frequencies between about 1805 MHz and 1880 MHz. In this example, VCO1 26 generates a periodic signal on line CLK1 corresponding to one of the 900 MHz channels (and thus within a range that is centered at about 900 MHz) for use both by receive circuitry 14 and transmit circuitry 16 when handset 10 is operating in the lower frequency band, and VCO2 28 generates a periodic signal on line CLK2 corresponding to one of the 1800 MHz channels (and thus within a range that is centered at about 1800 MHz), again for use both by receive circuitry 14 and transmit circuitry 16 when handset 10 is operating in the higher frequency band. In handset 10, only one of VCOs 26, 28 is enabled to operate at any one time, with the selection made by DSP and controller circuitry 20 via control line VCOSEL, as shown in FIG. 1.

The periodic signals on line CLK1, CLK2, as the case may be, are synchronized in handset 10 relative to a stable reference clock signal generated by crystal oscillator 35, on line REFCLK. Synchronization is carried out by synthesizer 30 in handset 10 of FIG. 1. In this regard, the outputs of VCOs 26, 28 on lines CLK1, CLK2 are connected together at line VCOCLK, after buffering by buffers 27, 29, respectively. Synthesizer 30 is thus operable to synchronize the clock signal on line VCOCLK from the selected one of VCOs 26, 28 with the reference clock signal on line REFCLK. The specific frequency at which such synchronization and synthesis is generated by synthesizer 30 is selected by DSP and controller circuitry 20, and communicated to synthesizer 30 on lines CTRL.

As noted above, it has been observed, in connection with the present invention, that the provision of a single loop filter for both VCOs 26, 28 is not suitable for high performance systems, particularly where the frequencies of operation differ widely as in the present example, as the loop filter parameters cannot be suitably optimized for both bands. According to the preferred embodiment of the invention, therefore, two loop filters 32, 34 are provided in handset 10. In this example, loop filter 32 receives a charge pump signal on line CP1 from synthesizer 30, and in turn generates a voltage on line V1 which controls the frequency of VCO1 26. Similarly, loop filter 34 receives a charge pump signal on line CP2 from synthesizer 30, and in turn generates a voltage on line V2 which controls the frequency of VCO2 28. In this example, loop filters 32, 34 are conventional low-pass filters, implemented by way of conventional R-C networks, with the capacitance and resistance values selected and optimized for the particular frequency band with which they are associated. It is contemplated that those of ordinary skill in the art having reference to this specification will be readily able to select the appropriate loop filter parameters for each particular implementation.

Those of ordinary skill in the art will recognize that other clock signals and synthesis circuitry will also be utilized in handset 10, for purposes of modulation, demodulation, and the like. This circuitry and functionality is not illustrated in FIG. 1 for the sake of clarity of description, but of course will be present in the actual realization of handset 10.

Figure 2:
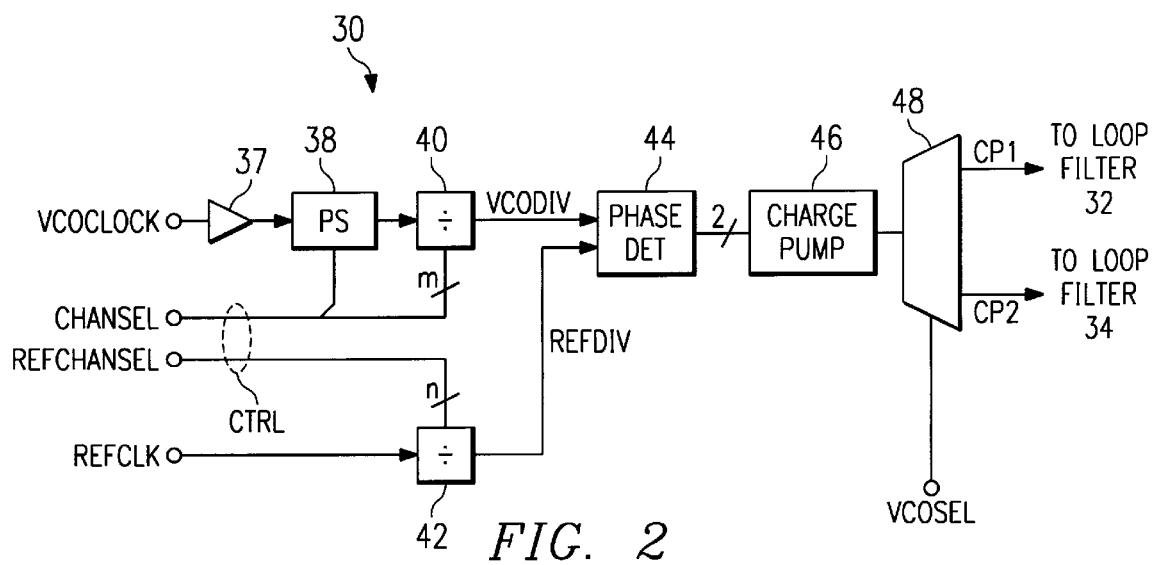
FIG. 2 is an electrical diagram, in block form, of a frequency synthesizer in the digital wireless telephone handset of FIG. 1, and constructed according to the preferred embodiment of the present invention.

Referring now to FIG. 2, the construction and operation of synthesizer 30 according to the preferred embodiment of the invention. As illustrated in FIG. 2, the output of the enabled ones of VCOs 26, 28 on line VCOCLK is received by buffer 37 in synthesizer 30, and applied to prescaler 38. Prescaler 38 divides the frequency of the signal on line VCOCLK by an integer value controlled by one of lines CHANSEL. Lines CHANSEL are part of the control lines issued by DSP and controller circuitry 20, for selecting the particular one of the channels within the selected frequency band at which handset 10 is to be operating. The output of prescaler 38 is applied to frequency divider 40, which divides the frequency of the signal by an integer value specified by lines CHANSEL from DSP and controller circuitry 20. Similarly, the reference clock signal generated by oscillator 35 on line REFCLK is received by frequency divider 42, which divides the reference frequency by an integer value specified by lines REFCHANSEL within control lines CTRL from DSP and controller circuitry 20.

The frequency of the signal generated by frequency divider 40 on line VCODIV based upon the output of the selected VCO 26, 28 on line VCOCLK, and the frequency of the signal generated by frequency divider 42 on line REFDIV based upon the reference clock signal from oscillator 35, are intended to match one another at a low frequency. For example, dividers 40, 42 generate output signals at a frequency on the order of 200 kHz, as the individual channels within a frequency band are, in this example, separated by approximately 200 kHz. Since the frequency of oscillator 35 does not change with the channel selection, the integer value by which frequency divider 42 divides the reference signal on line REFCLK will generally remain set. However, the integer value by which frequency divider 40 divides the VCO signal on line VCOCLK will change, under the control of lines CHANSEL from DSP and controller circuitry 20, with the particular channel to be used in the current communication. This integer value will thus vary inversely with the actual frequency of the channel, so that the clock signal on line VCODIV will nominally match that on line REFDIV, for example at about 200 kHz.

Phase detector 44 receives lines VCODIV and REFDIV at its inputs, and generates control signals based upon the phase relationship therebetween; these control signals are applied to charge pump 46. Charge pump 46 may be considered as a pair of controllable charge pumps, one for raising the voltage at an output node and the other for lowering the voltage at an output node. In this example, the control signals produced by phase detector 44 will include an up signal that indicates, when active, that the output voltage at charge pump 46 is to increase, and a down signal that indicates, when active, that the output voltage from charge pump 46 is to decrease. Typically, charge pump 46 will generate pulses at a duty cycle and frequency corresponding to the phase difference between the two signals. Of course, the number and type of control signals issued by phase detector 44 will correspond to the construction of charge pump 46. In this example, where the selected one of VCOs 26, 28 increases in frequency with a the voltage of its control signal V1, V2 (FIG. 1), phase detector 44 will issue a control signal to charge pump 46 to increase its output voltage in response to the signal on line VCODIV lagging the signal on line REFDIV (indicating that the frequency at line VCOCLK is too low). Conversely, phase detector 44 will issue a control signal to charge pump 46 to decrease its output voltage in response to the signal on line VCODIV leading the signal on line REFDIV (indicating that the frequency at line VCOCLK is too high).

The output of charge pump 46, according to this embodiment of the invention, is applied to switch 48. Switch 48 applies the output of charge pump 46 either to line CP1 or to line CP2 in response to the control signal on line VCOSEL from DSP and controller circuitry 20. Switch 48 is preferably implemented into the same integrated circuit as charge pump 46, for purposes of noise reduction, and reduction in switching transients. As shown in FIG. 1, line CP1 is forwarded to loop filter 32, while line CP2 is forwarded to loop filter 34. Accordingly, line VCOSEL, besides enabling the selected one of VCOs 26, 28, also controls the application of the output of charge pump 46 to the appropriate one of loop filters 34, 36 associated with the selected VCO 26, 28.

The inclusion of switch 48 according to the preferred embodiment of the invention permits the optimization of loop filter 32 for the frequencies at which its associated VCO1 26 operates, and permits the optimization of loop filter 34 for the frequencies at which its associated VCO2 28 operates. This optimization, according to frequency, is essential for high performance and rapid lock in operation of the RF portion of handset 10, particularly in the changing of channels. This excellent optimization and resultant performance is obtained, according to this preferred embodiment of the invention, while still utilizing much of synthesizer 30 in common for either one of the possible frequency bands. As is evident from FIG. 2, buffer 37, prescaler 38, frequency divider 40, phase detector 44 and charge pump 46 are used regardless of which frequency band is selected, thus reducing the integrated circuit chip area, and possibly also power dissipation, required for realization of the synthesizer function.

In addition to switching the output of charge pump 46, it is also contemplated that other signals may be similarly controlled by counterparts to switch 48, also under the control of line VCOSEL from DSP and controller circuitry 20. For example, many conventional synthesizer circuits, particularly in digital wireless telephone equipment, utilize speed-up techniques to facilitate the rapid changing of communications channels. A well-known example of such a technique provides a speed-up counter having an output that is applied to one of the elements (typically a resistor) in loop filters 32, 34 to change its time constant for a selected duration upon a channel change, thus permitting its associated respective VCO 26, 28 to rapidly acquire the new channel frequency. According to the preferred embodiment of the invention, a counterpart switch may be placed at the output of the speed-up counter, so that this signal may be applied to the appropriate one of loop filters 32, 34 in this event.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A phase-locked loop circuit for generating a periodic signal that is synchronized with a reference signal, comprising:

first and second loop filters;

a first voltage-controlled oscillator, for generating at an output thereof a periodic signal at a frequency within a first frequency range corresponding to a first control voltage from the first loop filter;

a second voltage-controlled oscillator, for generating at an output thereof a periodic signal at a frequency within a second frequency range, different from the first frequency range, corresponding to a second control voltage from the second loop filter, the output of the first and second voltage-controlled oscillators being coupled together at a common node;

a regulated voltage circuit, having a first input coupled to the common node and having a second input coupled to receive the reference signal, for generating a frequency control level corresponding to the phase relationship of a signal at the common node relative to the reference signal; and a switch, having an input coupled to receive the frequency control level from the regulated voltage circuit, having a first output coupled to the first loop filter, having a second output coupled to the second loop filter, for applying the frequency control level from the regulated voltage circuit at its first output responsive to receiving a select signal indicating selection of the first voltage-controlled oscillator, and for applying the frequency control level from the regulated voltage circuit at its second output responsive to receiving a select signal indicating selection of the second voltage-controlled oscillator.

2. The circuit of claim 1, wherein the first and second loop filters each comprise low-pass filters.

3. The circuit of claim 1, wherein each of the first and second voltage-controlled oscillators have a control input coupled to receive the select signal, so that the first voltage-controlled oscillator is enabled responsive to the select signal indicating selection of the first voltage-controlled oscillator, and so that the second voltage-controlled oscillator is enabled responsive to the select signal indicating selection of the second voltage-controlled oscillator.

4. A phase-locked loop circuit for generating a periodic signal that is synchronized with a reference signal, comprising:

first and second loop filters;

a first voltage-controlled oscillator, for generating at an output thereof a periodic signal at a frequency within a first frequency range corresponding to a first control voltage from the first loop filter;

a second voltage-controlled oscillator, for generating at an output thereof a periodic signal at a frequency within a second frequency range, different from the first frequency range, corresponding to a second control voltage from the second loop filter, the output of the first and second voltage-controlled oscillators being coupled together at a common node;

a regulated voltage circuit, having a first input coupled to the common node and having a second input coupled to receive the reference signal, for generating a frequency control level corresponding to the phase relationship of a signal at the common node relative to the reference signal, the regulated voltage circuit comprising:

a phase detector, having a first input coupled to the common node to receive the outputs of the first and second voltage-controlled oscillators, and having a second input coupled to receive the reference signal, for generating at an output thereof a control signal responsive to a phase difference between the signals at the first and second inputs thereof; and a charge pump, for generating the frequency control level responsive to the control signal from the phase detector; and a switch, having an input coupled to receive the frequency control level from the regulated voltage circuit, having a first output coupled to the first loop filter, having a second output coupled to the second loop filter, for applying the frequency control level from the regulated voltage circuit at its first output responsive to receiving a select signal indicating selection of the first voltage-controlled oscillator, and for applying the frequency control level from the regulated voltage circuit at its second output responsive to receiving a select signal indicating selection of the second voltage-controlled oscillator.

5. The circuit of claim 4, further comprising:
a first frequency divider, having an input coupled to the common node, and having an output coupled to the first input of the phase detector.

6. The circuit of claim 5, further comprising:
a second frequency divider, having an input coupled to receive the reference signal, and having an output coupled to the second input of the phase detector.

7. An electronic system, comprising:
functional circuitry, operable at a selected frequency in first and second frequency bands;
first and second loop filters;
a first voltage-controlled oscillator for generating, at an output coupled to the functional circuitry, a periodic signal at a frequency within the first frequency band corresponding to a first control voltage from the first loop filter;
a second voltage-controlled oscillator for generating, at an output coupled to the functional circuitry, a periodic signal at a frequency within the second frequency range corresponding to a second control voltage from the second loop filter, the outputs of the first and second voltage-controlled oscillators also coupled together at a common node;
a regulated voltage circuit, having a first input coupled to the common node and having a second input coupled to receive the reference signal, for generating a frequency control level corresponding to the phase relationship of a signal at the common node relative to the reference signal; and
a switch, having an input coupled to receive the frequency control level from the regulated voltage circuit, having a first output coupled to the first loop filter, having a second output coupled to the second loop filter, for applying the frequency control level from the regulated voltage circuit at its first output responsive to receiving a select signal indicating selection of the first voltage-controlled oscillator, and for applying the frequency control level from the regulated voltage circuit at its second output responsive to receiving a select signal indicating selection of the second voltage-controlled oscillator.

8. The system of claim 7, further comprising:
control circuitry for generating the select signal.

9. The system of claim 7, wherein the first and second loop filters each comprise low-pass filters.

10. The system of claim 7, wherein each of the first and second voltage-controlled oscillators have a control input coupled to receive the select signal, so that the first voltage-controlled oscillator is enabled responsive to the select signal indicating selection of the first voltage-controlled oscillator, and so that the second voltage-controlled oscillator is enabled responsive to the select signal indicating selection of the second voltage-controlled oscillator.

11. An electronic system, comprising:
functional circuitry operable at a selected frequency in first and second frequency bands;
first and second loop filters;
a first voltage-controlled oscillator for generating, at an output coupled to the functional circuitry, a periodic signal at a frequency within the first frequency band corresponding to a first control voltage from the first loop filter;
a second voltage-controlled oscillator for generating at an output coupled to the functional circuitry, a periodic signal at a frequency within the second frequency range corresponding to a second control voltage from the second loop filter, the outputs of the first and second voltage-controlled oscillators also coupled together at a common node;
a regulated voltage circuit, having a first input coupled to the common node and having a second input coupled to receive the reference signal, for generating a frequency control level corresponding to the phase relationship of a signal at the common node relative to the reference signal the regulated voltage circuit comprising:
  a phase detector, having a first input coupled to the common node to receive the outputs of the first and second voltage-controlled oscillators, and having a second input coupled to receive the reference signal, for generating at an output thereof a control signal responsive to a phase difference between the signals at the first and second inputs thereof; and
  a charge pump, for generating the frequency control level responsive to the control signal from the phase detector;
a switch, having an input coupled to receive the frequency control level from the regulated voltage circuit, having a first output coupled to the first loop filter, having a second output coupled to the second loop filter, for applying the frequency control level from the regulated voltage circuit at its first output responsive to receiving a select signal indicating selection of the first voltage-controlled oscillator, and for applying the frequency control level from the regulated voltage circuit at its second output responsive to receiving a select signal indicating selection of the second voltage-controlled oscillator; and
control circuitry for generating the select circuit.

12. The system of claim 11, further comprising:
a first frequency divider, having an input coupled to the common node, and having an output coupled to the first input of the phase detector.

13. The system of claim 12, further comprising:
control circuitry, for applying a control signal to the first frequency divider to select a frequency divide ratio for the first frequency divider.

14. The system of claim 12, further comprising:
a second frequency divider, having an input coupled to receive the reference signal, and having an output coupled to the second input of the phase detector.

15. An electronic system, comprising:
functional circuitry operable at a selected frequency in first and second frequency bands;
first and second loop filters;
a first voltage-controlled oscillator for generating, at an output coupled to the functional circuitry, a periodic signal at a frequency within the first frequency band corresponding to a first control voltage from the first loop filter;

a second voltage-controlled oscillator for generating, at an output coupled to the functional circuitry, a periodic signal at a frequency within the second frequency range corresponding to a second control voltage from the second loop filter, the outputs of the first and second voltage-controlled oscillators also coupled together at a common node;

transmit circuitry of said functional circuitry, coupled to the outputs of the first and second voltage-controlled oscillators, for generating communications signals at an antenna;

receiver circuitry of said functional circuitry, coupled to the outputs of the first and second voltage-controlled oscillators, for processing communications signals received at the antenna;

a regulated voltage circuit, having a first input coupled to the common node and having a second input coupled to receive the reference signal, for generating a frequency control level corresponding to the phase relationship of a signal at the common node relative to the reference signal; and a switch, having an input coupled to receive the frequency control level from the regulated voltage circuit, having a first output coupled to the first loop filter, having a second output coupled to the second loop filter, for applying the frequency control level from the regulated voltage circuit at its first output responsive to receiving a select signal indicating selection of the first voltage-controlled oscillator, and for applying the frequency control level from the regulated voltage circuit at its second output responsive to receiving a select signal indicating selection of the second voltage-controlled oscillator.

16. A method of generating a periodic signal, comprising the steps of:

enabling a selected one of a plurality of voltage controlled oscillators, the plurality of voltage-controlled oscillators having outputs coupled to a common node, and each of the plurality of voltage controlled oscillators for generating, when enabled, a periodic signal within an associated frequency range responsive to a frequency control voltage applied thereto by an associated one of a plurality of loop filters;

comparing the output of the selected one of the plurality of voltage-controlled oscillators at the common node with a reference signal;

generating a frequency control signal responsive to the comparing step; and applying the frequency control signal to the one of the plurality of loop filters associated with the enabled one of the plurality of voltage-controlled oscillators, to control the frequency of the enabled one of the plurality of voltage-controlled oscillators.

17. The method of claim 16, further comprising:

prior to the comparing step, dividing the frequency of the output of the selected one of the plurality of voltage-controlled oscillators at the common node to produce a divided-frequency oscillator signal, so that the comparing step compares the divided-frequency oscillator signal with the reference signal.

18. The method of claim 17, further comprising:

prior to the comparing step, dividing the frequency of the reference signal, so that the comparing step compares the divided-frequency reference signal with the divided-frequency oscillator signal.

19. The method of claim 17, further comprising:

repeating the comparing, generating, and applying steps.

20. The method of claim 19, further comprising:

after repeating the comparing, generating, and applying steps, controlling the first frequency divider to divide the frequency of the output of the selected one of the plurality of voltage-controlled oscillators at the common node by a different ratio; and then repeating the comparing, generating, and applying steps.

* * * * *